(12) United States Patent
Weber et al.

(10) Patent No.: US 9,372,235 B2
(45) Date of Patent: Jun. 21, 2016

(54) METHODS OF ESTIMATING ROTOR MAGNET TEMPERATURE AND SYSTEMS THEREOF

(71) Applicants: Anthony Weber, Moline, IL (US);
David Holmburg, Moline, IL (US);
Long Wu, Fargo, ND (US)

(72) Inventors: Anthony Weber, Moline, IL (US);
David Holmburg, Moline, IL (US);
Long Wu, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 87 days.

(21) Appl. No.: 14/501,749

(22) Filed: Sep. 30, 2014

(65) Prior Publication Data

US 2016/0091568 A1 Mar. 31, 2016

(51) Int. Cl.
*G05D 23/00* (2006.01)
*G01R 31/34* (2006.01)
*H02P 29/02* (2016.01)

(52) U.S. Cl.
CPC ............ *G01R 31/343* (2013.01); *H02P 29/028* (2013.01)

(58) Field of Classification Search
CPC .................................... H02P 6/14; H02P 7/00
USPC .......... 318/471, 472, 400.02, 400.03, 400.07, 318/400.14, 400.15, 400.32, 400.34, 715, 318/721, 778, 779, 800, 801, 599, 811, 432, 318/783, 823, 430, 442; 388/800, 815, 854, 388/934
See application file for complete search history.

(56) References Cited

U.S. PATENT DOCUMENTS

| 7,979,171 | B2 | 7/2011 | Wu et al. | |
|---|---|---|---|---|
| 8,547,045 | B2 * | 10/2013 | Wu | H02P 7/285 318/400.02 |
| 8,981,694 | B2 * | 3/2015 | Yoon | H02P 6/165 318/400.32 |
| 2012/0212169 | A1* | 8/2012 | Wu | H02P 7/285 318/432 |
| 2015/0200614 | A1* | 7/2015 | Diaz Reigosa | H02P 29/0066 318/400.21 |
| 2015/0295531 | A1* | 10/2015 | Kim | G01K 13/08 318/400.22 |

OTHER PUBLICATIONS

X. Ding, "OnlineTemperature Estimation of IPMSM Permanent Magnets in Hybrid Electric Vehicles,", 2011, 5pgs, 6th IEEE Conference on Industrial Electronics and Applications (ICIEA) Conference, Xi'an, China.
A. Specht, "Observer for the Rotor Temperature of IPMSM," 14th International Power Electronics and Motion Control Conference, EPE-PEMC, 2010, 4pgs, Paderborn, Germany.
M. Ganchev, "Compensation of Speed Dependence in Sensorless Rotor Temperature Estimation for Permanent-Magnet Synchronous Motor", Nov./Dec. 2013, 9pgs, IEEE Transactions on Industry Applications, vol. 49, No. 6.
M. Olszewski, "Barriers to the Application of High-Temperature Coolants in Hybrid Electric Vehicles," Sep. 2006.
R. Krishnan, "Fast Estimation and Compensation of Rotor Flux Linkage in Permanent Magnet Synchronous Machines", 1999, 6Pgs, Proc. IEEE International Symposium on Ind. Electron. ISIE 1999, vol. 2.

* cited by examiner

*Primary Examiner* — Antony M Paul
(74) *Attorney, Agent, or Firm* — Harness, Dickey & Pierce, P.L.C.

(57) ABSTRACT

At least one example embodiment discloses a method of estimating a rotor magnet temperature of a motor. The method includes determining an applied voltage during operation of the motor at an operating point, obtaining a reference value associated with the operating point and associated with a reference temperature and determining an estimated rotor magnet temperature based on the applied voltage and the reference value.

18 Claims, 6 Drawing Sheets

METHODS OF ESTIMATING ROTOR MAGNET TEMPERATURE AND SYSTEMS THEREOF

FIELD

Example embodiments are related to electric drive device systems and/or methods for controlling electric drive devices such as Permanent Magnet Synchronous Machine (PMSM) motors or machines.

BACKGROUND

Alternating current (ac) machines (e.g., PMSM machines) are extensively used vehicle traction applications. A PMSM machine controller controls operation of the PMSM machine. The controller produces ac control signals which are applied to the terminals of the PMSM machine.

PMSMs are used due to their power density, efficiency, torque capability, size, and wide constant power operating region. One of the most widely used rare earth magnets in PMSMs are neodymium-iron-boron (NdFeB) magnets. NdFeB magnets are candidates for PMSMs due to their energy density, and intrinsic coercivity (Hci). Unfortunately the NdFeB magnets have a low resistivity which can lead to eddy currents in the magnets. Also, NdFeB magnets intrinsic coercivity and residual flux density are dependent on temperature, and their value decreases as the temperature increases. Finally a back electromotive force (bemf) constant ($\lambda_f$) is directly proportional the residual flux density. In other words, as the temperature increases the bemf constant decreases.

Ambient temperature, machine operating speed (PM eddy current losses), current regulation quality and THD level, current magnitude and duration, and machine cooling are factors which affect rotor magnet temperature and, as a result, affect the bemf constant.

SUMMARY

Some embodiments are directed to methods of estimating a rotor magnet temperature and systems for estimating the rotor magnet temperature.

At least one example embodiment discloses a method of estimating a rotor magnet temperature of a motor. The method includes determining an applied voltage during operation of the motor at an operating point, obtaining a reference value associated with the operating point and associated with a reference temperature and determining an estimated rotor magnet temperature based on the applied voltage and the reference value.

BRIEF DESCRIPTION OF THE DRAWINGS

Example embodiments will be more clearly understood from the following detailed description taken in conjunction with the accompanying drawings.

FIG. 1 illustrates a block diagram of FIGS. 1A-1B;
FIG. 2 is a block diagram of an electronic data processing system consistent with FIGS. 1A-1B, according to an example embodiment;
FIG. 3 illustrates a rotor magnet temperature estimation module, according to an example embodiment;
and
FIG. 4 illustrates a method of estimating a rotor magnet temperature of a motor, according to an example embodiment.

DETAILED DESCRIPTION

Figure 1:
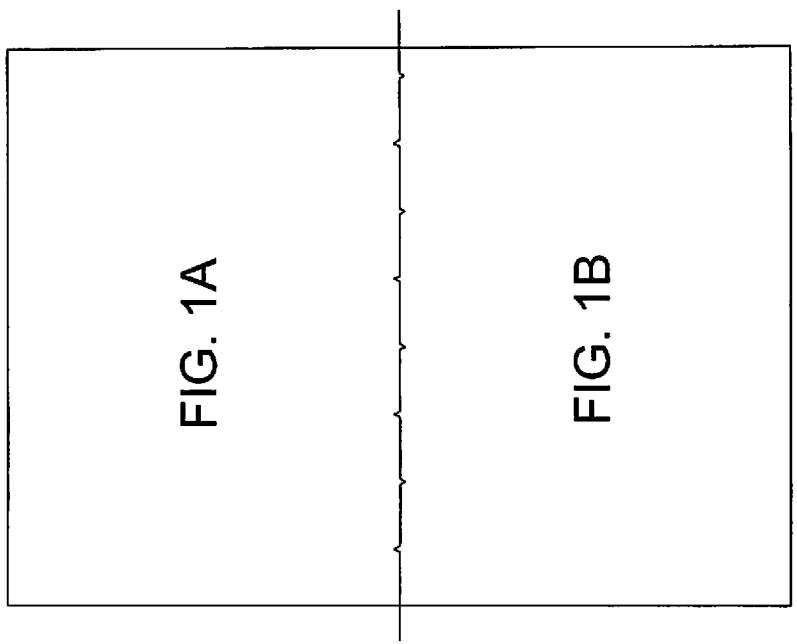
FIGS. 1-4 represent non-limiting, example embodiments as described herein.

Various example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms a processor specifically programmed to execute software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of example embodiments are typically encoded on some form of tangible (or recording) storage medium or implemented over some type of transmission medium. The tangible storage medium may be magnetic (e.g., a floppy disk or a hard drive) or optical (e.g., a compact disk read only memory, or "CD ROM"), and may be read only or random access.

Figure 1A:
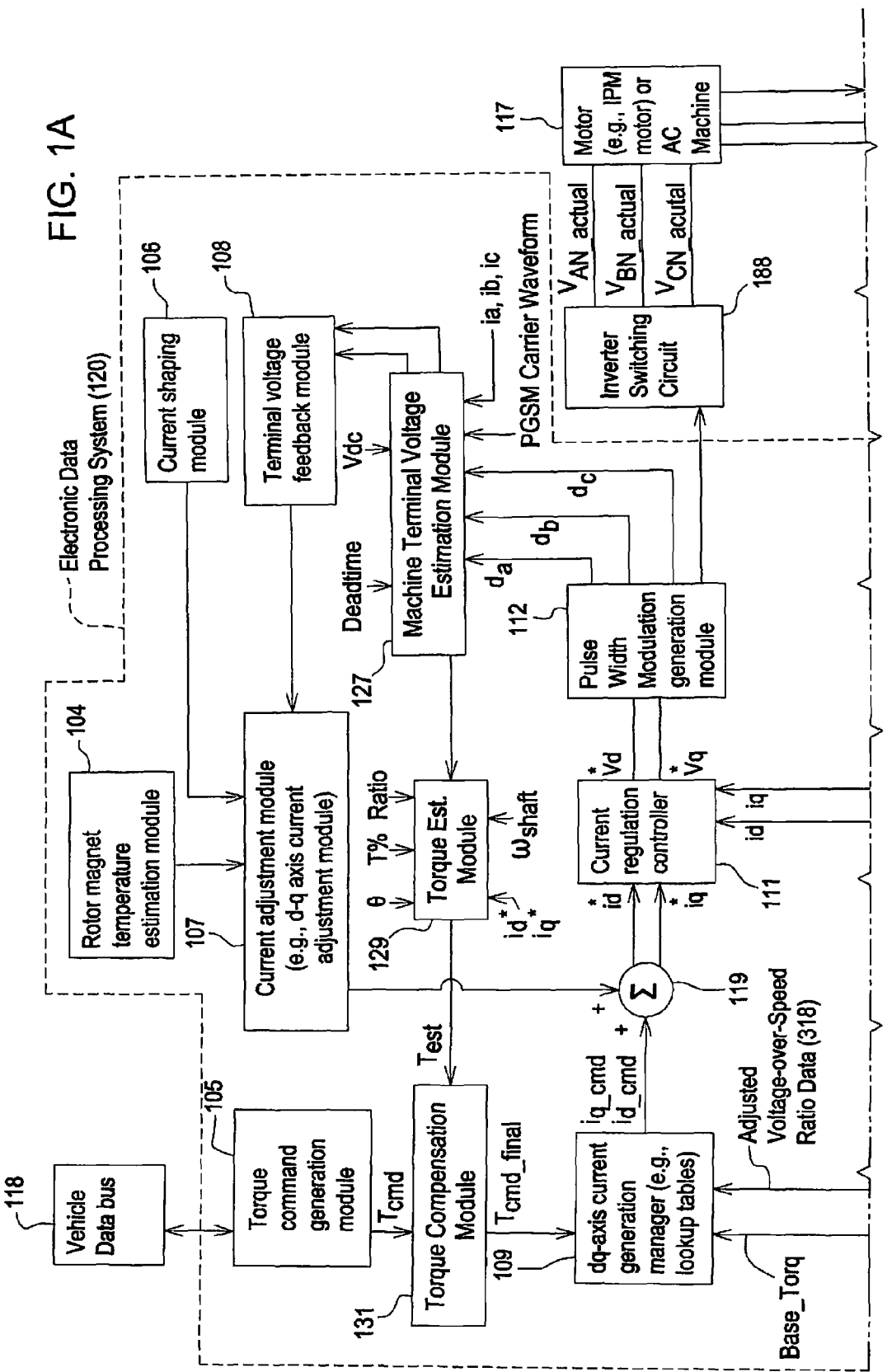
FIGS. 1A-1B is a block diagram of a system for controlling an electrical motor, according to an example embodiment.
Figure 1B:
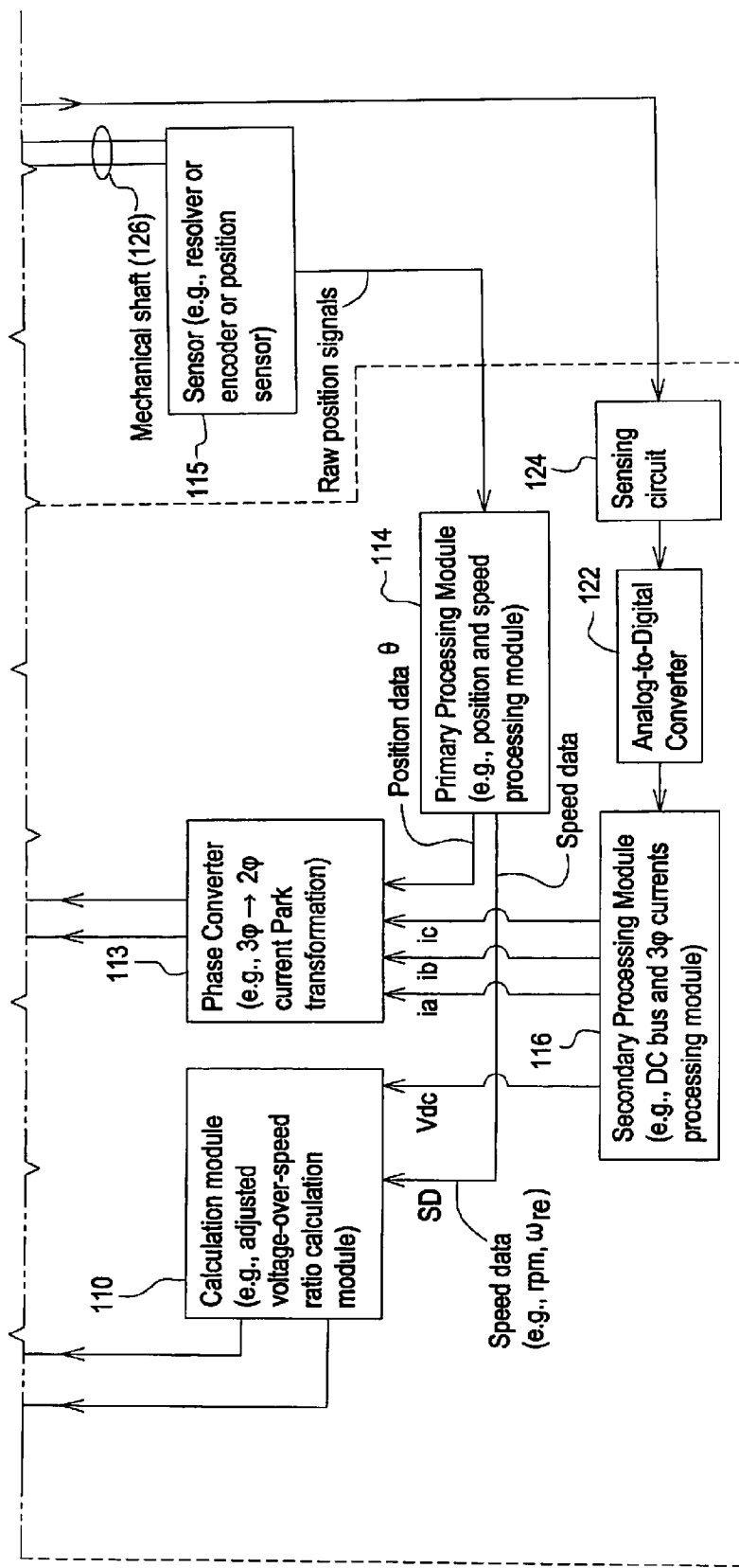

In accordance with an example embodiment, FIGS. 1A-1B illustrates a drive system 100 for controlling a machine such as an electric motor.

The drive system 100 includes a processor configured to determine an applied voltage during operation of a motor at an operating point obtain a reference value associated with the operating point and associated with a reference temperature and determine an estimated rotor magnet temperature of the motor based on the applied voltage and the reference value.

In an example embodiment, the reference value is a reference quadrature axis voltage.

In an example embodiment, the applied voltage is an instantaneous quadrature axis voltage.

In an example embodiment, the processor is configured to determine a difference between the instantaneous quadrature axis voltage and the reference quadrature axis voltage and determine the estimated rotor magnet temperature based on the difference.

In an example embodiment, the processor is configured to obtain a magnet temperature coefficient from a lookup table, the lookup table providing magnet temperature coefficients corresponding to machine temperatures, the estimated rotor magnet temperature being further based on the obtained magnet temperature coefficient.

In an example embodiment, the operating point is a speed and torque of the motor.

In an example embodiment, the processor is configured to filter the estimated rotor magnet temperature.

In an example embodiment, the processor is configured to obtain a reference voltage from a lookup table, the lookup table being based on the applied voltage and modify the reference voltage based on a ratio of the applied voltage to a common voltage, the reference value being based on the modified reference voltage.

In an example embodiment, the processor is configured to obtain a reference voltage from a lookup table, the lookup table being based on a characterization voltage and modify the reference voltage based on a ratio of the applied voltage to a characterization voltage, the reference value being based on the modified reference voltage.

Referring to FIG. 1, the electrical motor may be a motor such as a motor 117 (e.g., an interior permanent magnet (IPM) motor) or another alternating current machine. The motor 117 has a nominal dc bus voltage (e.g., 320 Volts). The nominal voltage is a named voltage. For example, a nominal voltage of the motor 117 may be 320 Volts, but the motor may operate at a voltage above and below 320 Volts. In an example embodiment, the system, aside from the motor 117, may be referred to as an inverter or a motor controller. The system for controlling the motor 117 may also be referred to as a machine system.

It should be understood that the drive system 100 may include additional features that are not illustrated in FIG. 1A. The features shown in FIGS. 1A-1B are illustrated for the convenience of describing the drive system 100 and it should be understood that the drive system 100 should not be limited to the features shown in FIGS. 1A-1B.

The system 100 includes electronic modules, software modules, or both. In an example embodiment, the drive system 100 includes an electronic data processing system 120 to support storing, processing or execution of software instructions of one or more software modules. The electronic data processing system 120 is indicated by the dashed lines in FIG. 1A-1B and is shown in greater detail in FIG. 2. The electronic data processing system 120 may also be referred to as a controller and/or processor for the motor 117. The data processing system 120 is configured to determine a current limit for the ac machine, determine a characterized peak current value based on a voltage-to-speed ratio of the ac machine, determine a torque command limit based on the characterized peak current value and the current limit and determine current command values for the ac machine based on the torque command limit.

The data processing system 120 is coupled to an inverter circuit 188. The inverter circuit 188 may be a three-phase inverter. The inverter circuit 188 includes a semiconductor drive circuit that drives or controls switching semiconductors (e.g., insulated gate bipolar transistors (IGBT) or other power transistors) to output control signals for the motor 117. In turn, the inverter circuit 188 is coupled to the motor 117.

In an example embodiment, a torque command generation module 105 is coupled to a torque compensation module, which is coupled to a d-q axis current generation manager 109 (e.g., d-q axis current generation look-up tables). The d-q axis current, which is in a rotating reference frame, refers to the direct axis current and the quadrature axis current as applicable in the context of vector-controlled alternating current machines, such as the motor 117.

The output of the d-q axis current generation manager 109 (d-q axis current commands iq_cmd and id_cmd) and the output of a current adjustment module 107 (e.g., d-q axis current adjustment module 107) are fed to a summer 119. In turn, one or more outputs (e.g., direct axis current data (id*) and quadrature axis current data (iq*)) of the summer 119 are provided or coupled to a current regulation controller 111. While the term current command is used, it should be understood that current command refers to a target current value.

The current regulation controller 111 is capable of communicating with the pulse-width modulation (PWM) generation module 112 (e.g., space vector PWM generation module). The current regulation controller 111 receives respective final d-q axis current commands (e.g., id* and iq*) and actual d-q axis currents (e.g., id and iq) and outputs corresponding d-q axis voltage commands (e.g., Vd* and Vq* commands) for input to the PWM generation module 112.

In an example embodiment, the PWM generation module 112 provides pulse commands for control of the inverter circuit 188. Outputs of the PWM generation module 112 are coupled to an inverter circuit 188. The output stage of the inverter circuit 188 (e.g., output present phase voltages $V_{AN}$, $V_{BN}$ and $V_{CN}$) provides a pulse-width modulated voltage waveform or other voltage signal for control of the motor 117. The voltages $V_{AN}$, $V_{BN}$ and $V_{CN}$ may be referred to as phase voltages, current control step voltages or present control step voltages, for example. In an example embodiment, the inverter circuit 188 is powered by a direct current (dc) voltage bus.

The inverter circuit 188 includes a semiconductor drive circuit that drives or controls switching semiconductors (e.g., insulated gate bipolar transistors (IGBT) or other power transistors) to output control signals for the motor 117. In turn, the inverter circuit 188 is coupled to the motor 117. The motor 117 is associated with a sensor 115 (e.g., a position sensor, a resolver or encoder position sensor) that is associated with the motor shaft 126 or the rotor. The sensor 115 and the motor 117 are coupled to the data processing system 120 to provide feedback data (e.g., current feedback data, such as phase current values ia, ib and ic), raw position signals, among other possible feedback data or signals, for example. Other possible feedback data includes, but is not limited to, winding temperature readings, semiconductor temperature readings of the inverter circuit 188, three phase voltage data, or other thermal or performance information for the motor 117.

The motor 117 is associated with the sensor 115 (e.g., a resolver, encoder, speed sensor, or another position sensor or speed sensors) that estimates at least one of an angular position of the motor shaft 126, a speed or velocity of the motor shaft 126, and a direction of rotation of the motor shaft 126. The sensor 115 may be mounted on or integral with the motor shaft 126. The output of the sensor 115 is capable of communication with the primary processing module 114 (e.g., position and speed processing module). In an example embodiment, the sensor 115 may be coupled to an analog-to-digital converter (not shown) that converts analog raw position data or velocity data to digital raw position or velocity data, respectively. In other example embodiments, the sensor 115 (e.g., digital position encoder) may provide a digital data output of raw position data or velocity data for the motor shaft 126 or rotor.

A first output (e.g., position data θ for the motor 117) of the primary processing module 114 is communicated to the phase converter 113 (e.g., three-phase to two-phase current Park transformation module) that converts respective three-phase digital representations of measured current into corresponding two-phase digital representations of measured current. A second output (e.g., speed data SD for the motor 117) of the primary processing module 114 is communicated to a calculation module 110 (e.g., voltage over speed ratio module).

An input of a sensing circuit 124 is coupled to terminals of the motor 117 for sensing at least the measured three-phase currents and a voltage level of the direct current (dc) bus (e.g., high voltage dc bus which may provide dc power to the inverter circuit 188). An output of the sensing circuit 124 is coupled to an analog-to-digital converter 122 for digitizing the output of the sensing circuit 124. In turn, the digital output of the analog-to-digital converter 122 is coupled to the secondary processing module 116 (e.g., dc bus voltage and three phase current processing module). For example, the sensing circuit 124 is associated with the motor 117 for measuring three phase currents (e.g., current applied to the windings of the motor 117, back EMF (electromotive force) induced into the windings, or both).

Certain outputs of the primary processing module 114 and the secondary processing module 116 feed the phase converter 113. For example, the phase converter 113 may apply a Park transformation or other conversion equations (e.g., certain conversion equations that are suitable are known to those of ordinary skill in the art) to convert the measured three-phase representations of current into two-phase representations of current based on the digital three-phase current data ia, ib and is from the secondary processing module 116 and position data θ from the sensor 115. The output of the phase converter 113 module (id, iq) is coupled to the current regulation controller 111.

Other outputs of the primary processing module 114 and the secondary processing module 116 may be coupled to inputs of the calculation module 110 (e.g., voltage over-speed ratio calculation module). For example, the primary processing module 114 may provide the speed data SD (e.g., motor shaft 126 speed in revolutions per minute and electric speed $\omega_{re}$), whereas the secondary processing module 116 may provide a measured (detected) level of the operating dc bus voltage Vdc of the motor 117 (e.g., on the dc bus of a vehicle). The dc voltage level on the dc bus that supplies the inverter circuit 188 with electrical energy may fluctuate or vary because of various factors, including, but not limited to, ambient temperature, battery condition, battery charge state, battery resistance or reactance, fuel cell state (if applicable), motor load conditions, respective motor torque and corresponding operational speed, and vehicle electrical loads (e.g., electrically driven air-conditioning compressor). The calculation module 110 is connected as an intermediary between the secondary processing module 116 and the d-q axis current generation manager 109. The output of the calculation module 110 can adjust or impact the current commands iq_cmd and id_cmd generated by the d-q axis current generation manager 109 to compensate for fluctuation or variation in the dc bus voltage, among other things.

The calculation module 110 generates a base torque value based on the speed data and dc bus voltage. Base torque values are respectively associated with discrete speed points with a nominal dc bus voltage level. In other words, calculation module 110 may be a two-dimensional base torque LUT that is established from a motor characterization procedure. During the IPM motor characterization procedure, each rotor shaft speed has a maximum output torque, which is defined as the base torque at that speed. Thus, the base torque may also be referred to as peak torque if the dc bus is at a nominal voltage. The base torque is a maximum achievable torque for a voltage and speed combination. An example of IPM motor characterization is described in U.S. application Ser. No. 13/036,286, filed Feb. 28, 2011, the entire contents of which are incorporated herein by reference.

The rotor magnet temperature estimation module 104, the current shaping module 106, and the terminal voltage feedback module 108 are coupled to or are capable of communicating with the d-q axis current adjustment module 107. In turn, the d-q axis current adjustment module 107 may communicate with the d-q axis current generation manager or the summer 119.

The rotor magnet temperature estimation module 104 estimates or determines the temperature of the rotor permanent magnet or magnets.

The rotor magnet temperature estimation module 104 is described in greater detail below.

In an example embodiment, the system may operate in the following manner. The torque command generation module 105 receives an input control data message, such as a speed control data message, a voltage control data message, or a torque control data message, over a vehicle data bus 118. The torque command generation module 105 converts the received input control message into raw torque control command data $T_{cmd}$.

The d-q axis current generation manager 109 selects or determines the direct axis current command and the quadrature axis current command associated with respective final torque control command data $T_{cmd}$, base torque command data Base_Torq and the voltage-over-speed ratio.

For example, the d-q axis current generation manager 109 selects or determines the direct axis current command and the quadrature axis current command by accessing one or more of the following: (1) a look-up table, database or other data structure that relates respective torque commands to corresponding direct and quadrature axes currents, (2) a set of quadratic equations or linear equations that relate respective torque commands to corresponding direct and quadrature axes currents, or (3) a set of rules (e.g., if-then rules) that relates respective torque commands to corresponding direct and quadrature axes currents. The sensor 115 on the motor 117 facilitates provision of the detected speed data SD for the motor shaft 126, where the primary processing module 114 may convert raw position data provided by the sensor 115 into speed data SD.

The current adjustment module 107 (e.g., d-q axis current adjustment module) provides current adjustment data to adjust the direct axis current command id_cmd and the quadrature axis current command iq_cmd based on input data from the rotor magnet temperature estimation module 104, the current shaping module 106, and terminal voltage feedback module 108.

The current shaping module 106 may determine a correction or preliminary adjustment of the quadrature axis (q-axis) current command and the direct axis (d-axis) current command based on one or more of the following factors: torque load on the motor 117 and speed of the motor 117, for example. The rotor magnet temperature estimation module 104 may generate a secondary adjustment of the q-axis current command and the d-axis current command based on an estimated change in rotor temperature, for example. The terminal voltage feedback module 108 may provide a third adjustment to d-axis and q-axis current based on controller voltage command versus voltage limit.

In an example embodiment, the motor 117 may include an interior permanent magnet (IPM) machine or a synchronous IPM machine (IPMSM).

The sensor 115 (e.g., shaft or rotor speed detector) may include one or more of the following: a direct current motor, an optical encoder, a magnetic field sensor (e.g., Hall Effect sensor), magneto-resistive sensor, and a resolver (e.g., a brushless resolver). In one configuration, the sensor 115 includes a position sensor, where raw position data and associated time data are processed to determine speed or velocity data for the motor shaft 126. In another configuration, the sensor 115 includes a speed sensor, or the combination of a speed sensor and an integrator to determine the position of the motor shaft.

In yet another configuration, the sensor 115 includes an auxiliary, compact direct current generator that is coupled mechanically to the motor shaft 126 of the motor 117 to determine speed of the motor shaft 126, where the direct current generator produces an output voltage proportional to the rotational speed of the motor shaft 126. In still another configuration, the sensor 115 includes an optical encoder with an optical source that transmits a signal toward a rotating object coupled to the motor shaft 126 and receives a reflected or diffracted signal at an optical detector, where the frequency of received signal pulses (e.g., square waves) may be proportional to a speed of the motor shaft 126. In an additional configuration, the sensor 115 includes a resolver with a first winding and a second winding, where the first winding is fed with an alternating current, where the voltage induced in the second winding varies with the frequency of rotation of the rotor.

Figure 2:
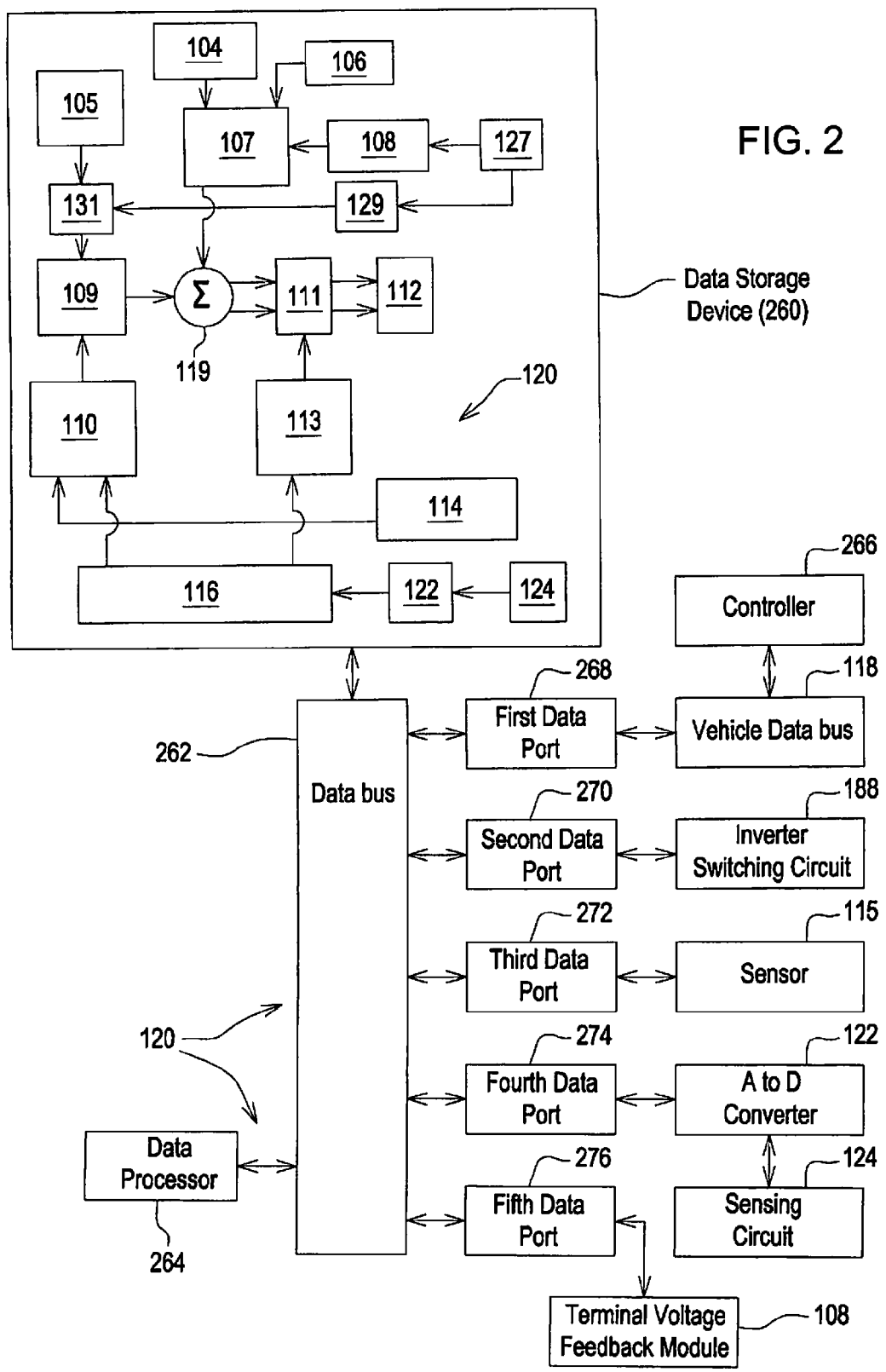

FIG. 2 is a block diagram of an electronic data processing system consistent with FIGS. 1A-1B, according to an example embodiment. In FIG. 2, the electronic data processing system 120 includes an electronic data processor 264, a data bus 262, a data storage device 260, and one or more data ports (268, 270, 272, 274 and 276). The data processor 264, the data storage device 260 and one or more data ports are coupled to the data bus 262 to support communications of data between or among the data processor 264, the data storage device 260 and one or more data ports.

In an example embodiment, the data processor 264 may include an electronic data processor, a microprocessor, a microcontroller, a programmable logic array, a logic circuit, an arithmetic logic unit, an application specific integrated circuit, a digital signal processor, a proportional-integral-derivative (PID) controller, or another data processing device.

The data storage device 260 may include any magnetic, electronic, or optical device for storing data. For example, the data storage device 260 may include an electronic data storage device, an electronic memory, non-volatile electronic random access memory, one or more electronic data registers, data latches, a magnetic disc drive, a hard disc drive, an optical disc drive, or the like.

As shown in FIG. 2, the data ports include a first data port 268, a second data port 270, a third data port 272, a fourth data port 274 and a fifth data port 276, although any suitable number of data ports may be used. Each data port may include a transceiver and buffer memory, for example. In an example embodiment, each data port may include any serial or parallel input/output port.

In an example embodiment as illustrated in FIG. 2, the first data port 268 is coupled to the vehicle data bus 118. In turn, the vehicle data bus 118 is coupled to a controller 266. In one configuration, the second data port 270 may be coupled to the inverter circuit 188; the third data port 272 may be coupled to the sensor 115; the fourth data port 274 may be coupled to the analog-to-digital converter 122; and the fifth data port 276 may be coupled to the terminal voltage feedback module 108. The analog-to-digital converter 122 is coupled to the sensing circuit 124.

In an example embodiment of the data processing system 120, the torque command generation module 105 is associated with or supported by the first data port 268 of the electronic data processing system 120. The first data port 268 may be coupled to a vehicle data bus 118, such as a controller area network (CAN) data bus. The vehicle data bus 118 may provide data bus messages with torque commands to the torque command generation module 105 via the first data port 268. The operator of a vehicle may generate the torque commands via a user interface, such as a throttle, a pedal, the controller 266, or other control devices.

In some example embodiments, the sensor 115 and the primary processing module 114 may be associated with or supported by a third data port 272 of the data processing system 120.

The data processor 264 may be specifically programmed to execute the rotor magnet temperature estimation module 104, the torque command generation module 105, the current shaping module 106, the current adjustment module 107, the terminal voltage feedback module 108, the dq-axis current generation manager 109, the calculation module 110, the current regulation controller 111, the PWM generation module 112, the phase converter 113, the primary processing module 114, the secondary processing module 116, the summer 119, the ADC 122, the sensing circuit 124, the machine terminal voltage estimation module 127, the torque estimation module 129 and the torque compensation module 131.

Ambient temperature, machine operating speed (PM eddy current losses), current regulation quality and THD level, current magnitude and duration, and machine cooling are factors which affect rotor magnet temperature and, as a result, affect the bemf constant $\lambda_f$.

As a magnet temperature increases and the bemf constant $\lambda_f$ decreases, the electromagnetic torque will also decrease. As a result, a machine's performance will decrease. The decrease in machine performance will be most evident when the inverter is operating in torque control mode as there will be no speed or voltage loop to modify the raw torque command. Besides reduced output torque performance, the magnet also runs the risk of irreversible demagnetization if at high temperatures.

IPMSM machine steady state stator voltage equations in the rotor reference frame are shown below.

$$v_{sq}^r = R_s i_{sq}^r + \omega_{re}[L_d i_{sd}^r + \lambda_f] \quad (1)$$

$$v_{sd}^r = R_s i_{sd}^r - \omega_{re} L_q i_{sq}^r \quad (2)$$

where r indicates the rotor reference frame, s indicates stator, $R_s$ is a resistance of a phase of the motor 117, $\omega_{re}$ is the electric speed of the motor 117, $L_d$ is the d-axis inductance, $L_q$ is the q-axis inductance, $i_{sq}^r$ is the q-axis current for the stator and $i_{sd}^r$ is the d-axis current for the stator. In other words, $i_d = i_{sd}^r$ and $i_q = i_{sq}^r$.

By comparing equations (1) and (2), the bemf constant $\lambda_f$ is only present in the q-axis terminal voltage $v_{sq}^r$. Assuming that the inductances $L_d$, $L_q$ are only functions of the current $i_d$, $i_q$, a change in the bemf constant $\lambda_f$ due to magnet temperature change will affect the q-axis terminal voltage $v_{sq}^r$. Therefore, a variation in magnet temperature will result in a variation of the bemf constant $\lambda_f$ and a variation of the bemf constant $\lambda_f$ will yield a change in the q-axis terminal voltage $v_{sq}^r$.

In at least one example embodiment, the rotor magnet temperature estimation module 104 calculates a difference in runtime q-axis voltage from a reference voltage value at a same operating point (e.g., same torque and speed), where the reference voltage is common to a fixed magnet temperature. Consequently, the d-axis inductance should be the same value. Therefore, by subtracting the runtime q-axis voltage from the reference voltage, the d-axis inductance is removed. Moreover, the temperature may be estimated when the motor 117 is under load.

Figure 3:
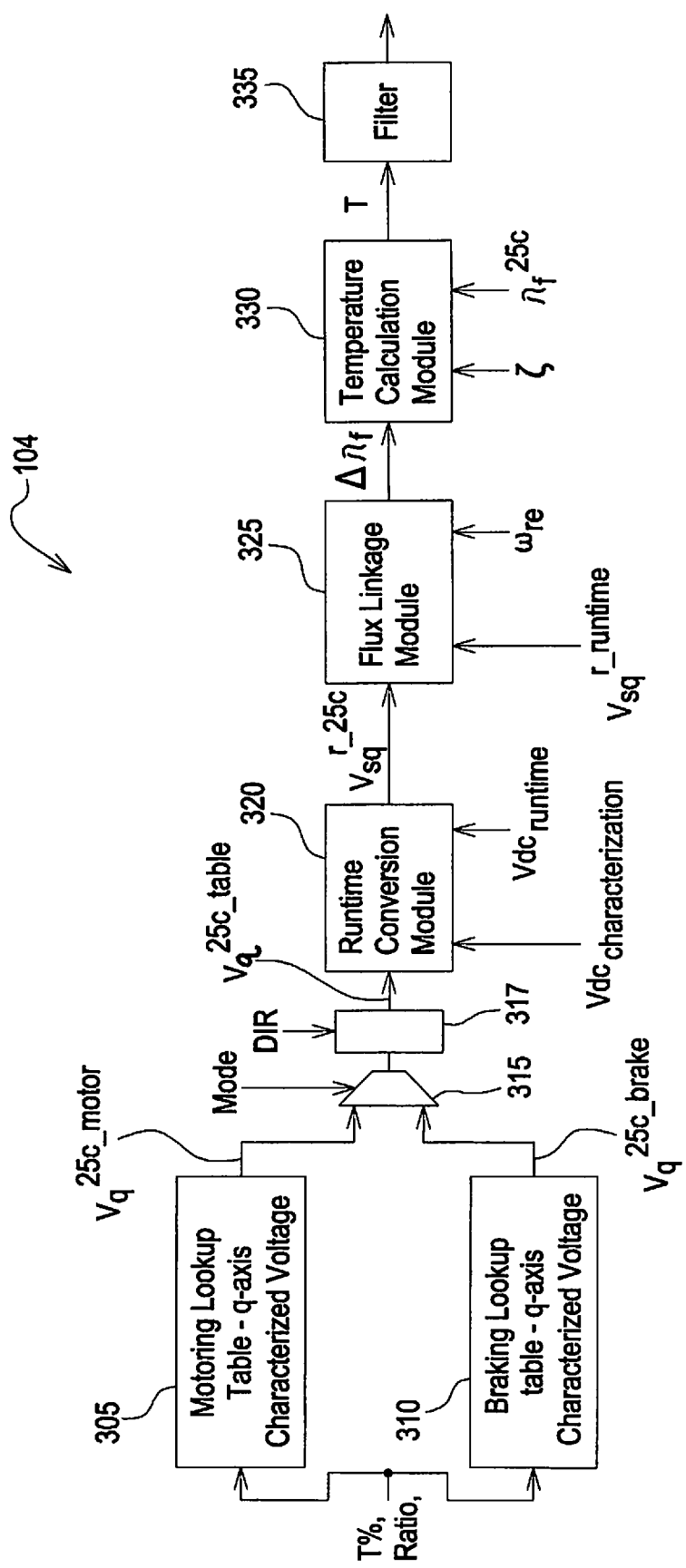

FIG. 3 illustrates the rotor magnet temperature estimation module 104, according to an example embodiment.

As shown, the rotor magnet temperature estimation module 104 may include a motoring lookup table for a q-axis characterized voltage 305, a braking lookup table for the q-axis characterized voltage 310, a selector 315, a runtime conversion module 320, a flux linkage module 325, a temperature calculation module 330 and a filter 335.

The motoring lookup table 305 and the braking lookup table 310 both receive the torque percentage T % and a voltage-to-speed ratio Ratio. The lookup tables 305 and 310 may be generated from the characterization procedure. In an IPM characterization procedure, machine efficiency data corresponding to each torque command percentage and voltage-speed ratio combination are available. Similar to the q-axis voltage reference motoring lookup table 305 and the braking lookup table 310 and the dq-axis current lookup table, an efficiency lookup table is also created from characterization, which also uses ratio and torque command percentage as inputs. Considering the efficiency table and current lookup tables have the same inputs, the efficiency lookup table is connected in parallel with the $i_d$ and $i_q$ lookup tables to share the same inputs. In the case of separate motoring and braking characterization, there are two different efficiency lookup tables for motoring and braking modes. Maximum torque per amp (MTPA) and maximum torque per volt (MTPV) curves are recorded for several different machine speeds during the characterization procedure. These three lookup table use the same T % command and DC bus voltage over speed as inputs.

Lookup tables, as described herein, may be stored as or structured as a file, a database, a group of data records, linked data records (e.g., a linked list) or in another suitable data structure.

During characterization, a q-axis terminal voltage $v_{sq}^{r\_characterization}$ and a flux linkage $\lambda_f^{characterization}$ are recorded for each characterization point.

Two different methods are used to record the q-axis terminal voltage $v_{sq}^{r\_characterization}$ and the flux linkage $\lambda_f^{characterization}$.

When the motor 117 is below a critical speed, the characterization is done at one bus voltage level. At each characterization point, the q-axis terminal voltage $v_{sq}^{r\_characterization}$ is recorded through the controller since the controller already calculates $v_{sq}^r$ using the terminal voltage estimation module 127 and the rotor position θ. In other words, the output of the terminal voltage estimation module 127 is $V_\alpha$ and $V_\beta$. Then, based on $V_\alpha$ and $V_\beta$, and the rotor position θ, the q-axis terminal voltage the rotor position θ can be calculated using a Park Transformation.

A moving average filter for the q-axis voltage is set to a large enough value such that the value is stable (not oscillating around an average value).

After the q-axis terminal voltage $vs_{sq}^{r\_characterization}$ is recorded at a certain point, the inverter 188 should be disabled ($i_{ds}^r = i_{qs}^r = 0$ A) while the speed remains constant. When the inverter 188 is disabled, a machine terminal voltage on a power analyzer is recorded. From equations (1) and (2), it is noticed that only $v_{sq}^r$ is contributing to the machine terminal voltage with the inverter 188 is disabled (since $i_{ds}^r = i_{qs}^r = 0$ A).

By rearranging equation (2), the flux linkage $\lambda_f^{characterization}$ can be obtained at the present operating point.

$$v_{sq}^{r\_disable\_drive} = V_{ll}^{power\_analyzer} * \sqrt{2/3} \quad (3)$$

$$\lambda_f^{characterization} = \frac{v_{sq}^{r\_disabled\_drive} - R_s * 0}{\omega_{re}} - L_d * 0 = \frac{v_{ll}^{power\_analyzer} * \sqrt{\frac{2}{3}}}{\omega_{re}} \quad (4)$$

where "ll" refers to line-to-line voltage.

Alternatively, keeping the inverter 188 may be enabled and the current commands could be set to zero after the $v_{sq}^{r\_characterization}$ parameter is recorded. Then, the estimated $v_{sq}^{r\_characterization}$ from the controller can be recorded and divided by speed to determine the flux linkage $\lambda_f^{characterization}$.

When the motor 117 is above critical speed, the inverter 188 flux weakens the machine by commanding a certain amount of negative d-axis current $i_{sd}^r$ regardless of the torque command $T_{cmd}$. The flux weakening operation will suppress the magnitude of the line-to-line terminal voltage below the DC bus voltage level. If the drive is disabled (no flux weakening) the line-to-line terminal voltage will be larger than a DC link voltage turning the inverter into a passive three phase rectifier. This means that the q-axis voltage $v_{sq}^{r\_characterization}$ is not the sole contributor to the machine terminal voltage since there is current flow between the motor 117 and the inverter 188. In other words equation (4) may not be used with the drive disabled to obtain the flux linkage $\lambda_f^{characterization}$.

To get around the issue of current flow between the machine and inverter when the inverter is disabled beyond critical speed, the same voltage to speed ratio point but with a fake lower controller bus voltage is used. This yields a lower critical speed and, as a result, a lower machine terminal voltage. The actual bus voltage remains the same, so when the drive is disabled the DC link true voltage will be higher than the motor generated voltage. Therefore, diodes in the inverter will not conduct and only the q-axis voltage $v_{sq}^r$ will contribute to the machine terminal voltage (since $i_{ds}^r = i_{qs}^r = 0$ A). Example (Vdc=700V, speed=9000 rpm, Ratio=700/9000, current command $i_{ds}^{r*} = -206.48$, current command $i_{qs}^{r*} = 38.27$ A) ($i_{ds}^{r*}$ and $i_{qs}^{r*}$ are current commands based on the current command lookup tables)

If 9000 rpm is above critical speed, the controller maximum voltage is modified to be 350V while the actual DC bus voltage is at 700V. To keep the same ratio the actual speed is 4500 rpm as shown below.

$$\text{same voltage - speed ratio} = \frac{700 \text{ V}}{9000 \text{ rpm}} = \frac{350 \text{ V}}{4500 \text{ rpm}}$$

A parameter in the controller can be used to reduce the value of Vdc as shown in the equation below.

$$V_{smax} = V_{dc} * \text{Voltage\_Compensation\_Factor} \quad (5)$$

If the characterization voltage is 700 Vdc, the controller can be modified to assume the voltage limit is 350 Vdc by using the Voltage_Compensation_Factor to be 0.5.

The q-axis terminal voltage $v_{sq}^{r\_characterization}$ can then be recorded with the machine speed set at 4500 rpm, the fake lower controller bus voltage at 350V, the actual bus voltage at 700V, current command $i_{ds}^{r*}$ at −206.48, and current command $i_{qs}^{r*}$ at 38.27 A.

After the q-axis terminal voltage $v_{sq}^{r\_characterization}$ is recorded, the drive is disabled and the machine terminal voltage of the power analyzer $V_{ll}^{power\_analyzer}$ is recorded with the power analyzer. Again since the actual bus voltage is at 700V, the diodes will not conduct since the actual bus voltage is greater than the machine terminal voltage as recorded by the power analyzer $V_{ll}^{power\_analyzer}$. Then using equation (4), the flux linkage $\lambda_f^{characterization}$ can be calculated for the specific operating point. However, note that $v_{sq}^{r\_characterization}$ and $\lambda_f^{characterization}$ are recorded at 4500 rpm, but the actual speed of interest is at 9000 rpm.

In the example embodiments, the motoring lookup table 305 and the braking lookup table 310 generate q-axis voltages $v_q^{25C\_motor}$, $v_q^{25C\_brake}$, respectively, at a magnet temperature reference for each characterization point. As described below, 25 degrees Celsius is used as a magnet temperature reference. However, it should be understood that another temperature reference may be used.

The q-axis voltages $v_q^{25C\_motor}$, $v_q^{25C\_brake}$, stored in the motoring lookup table 305 and the braking lookup table 310, are generated as follows.

Based on the q-axis characterization voltages $v_{sq}^{r\_characterization}$, the flux linkages $\lambda_f^{characterization}$, and a flux linkage at the reference temperature $\lambda_f^{25C}$, a q-axis voltage at a magnet temperature reference of 25° C. $v_{sq}^{r\_characterization\_25C}$, for each characterization point can be calculated.

Calculating the flux linkage at the reference temperature $\lambda_f^{25C}$ can be obtained in the laboratory using a dynamometer. The first step in calculating the flux linkage at 25° C. is to set the room temperature and IPMSM coolant (or oil) to 25° C. at a selected characterization flow rate. Let the coolant (oil) run though the motor 117 so the motor 117 reaches a thermal equilibrium of 25° C. With the inverter 188 disabled (no machine currents), the motor 117 is spun via a prime mover at a relatively low speed (e.g., 100 rpm to 300 rpm) to minimize the rotor heating losses at high speed. The line-to-line voltage of the motor 117 under test with the power analyzer is then recorded. The equations below are used to calculate the per phase magnitude of the flux linkage for a positive speed direction.

$$\lambda_f^{25C\_pos\_speed} = \frac{v_{ll}^{power\_analyzer} * \sqrt{\frac{2}{3}}}{\omega_{re}} \quad (6)$$

where $$\omega_{re} = \omega_{rpm} * \frac{2 * pi}{60} * polepair,$$

$\omega_{rpm}$ is the mechanical speed and "polepair" is the number of pole-pairs.

To test for symmetry, the process above is repeated using the same speed but an opposite speed direction to obtain a flux linkage $\lambda_f^{25C\_neg\_speed}$ for the opposite speed direction using the same equation as equation (6). The flux linkage at the reference temperature $\lambda_f^{25C}$ is an average of the two flux linkage values $\lambda_f^{25C\_neg\_speed}$ and $\lambda_f^{25C\_pos\_speed}$.

Two different equations are used to calculate $v_{sq}^{r\_characterization\_25C}$. One equation is for when the motor 117 is below the critical speed and one equation is when the motor 117 is above the critical speed.

As stated above, when the motor 117 is below the critical speed, the characterization is done at one bus voltage level. Thus, the q-axis voltage at the magnet temperature reference $v_{sq}^{r\_characterization\_25C}$ can be calculated at each characterization point below critical speed as:

$$v_{sq}^{r\_characterization\_25C} = v_{sq}^{r\_characterization} + (\lambda_f^{25C} - \lambda_f^{characterization}) * \omega_{re} \quad (7)$$

As described above, the q-axis voltage $v_{sq}^{r\_characterization}$ and the flux linkage $\lambda_f^{characterization}$ are recorded at a specific voltage to speed ratio characterization point, but the controller bus voltage is reduced as the motor 117 was beyond critical speed. The mismatch in controller bus voltage for each voltage to speed ratio characterization point is considered.

The q-axis voltage when the magnet temperature is 25° C. and the controller bus voltage is at a reduced voltage level $v_{sq}^{r\_characterization\_25C\_low\_Vdc}$ (as compared to the voltage level when the motor 117 was characterized below critical speed) is calculated as:

$$v_{sq}^{r\_characterization\_25C\_low\_Vdc} = v_{sq}^{r\_characterization} + (\lambda_f^{25C} - \lambda_f^{characterization}) * \omega_{re} \quad (8)$$

The reduced voltage $v_{sq}^{r\_characterization\_25C\_low\_Vdc}$ is adjusted to match the same characterized DC bus voltage that was used when the machine was below critical speed. The adjustment is shown in the below example.

For example, two equations of q-axis voltage at a magnet temperature of 25° C. with the same ratio, but different DC bus voltages and speeds (assuming steady state) are:

$$v_{sq}^{r\_25C\_250Vbus} = R_s^{25C} i_{sq}^r + \omega_{re}^{250Vbus}[L_d i_{sd}^r + \lambda_f^{25C}]$$

$$v_{sq}^{r\_25C\_700Vbus} = R_s^{25C} i_{sq}^r + \omega_{re}^{700Vbus}[L_d i_{sd}^r + \lambda_f^{25C}]$$

Due to the same voltage to speed ratio, the motor currents $i_{sq}^r$, $i_{sd}^r$ and parameters $L_d$, $R_s^{25C}$, $\lambda_f^{25C}$ are the same at a 250V DC bus and 700V DC bus. The only difference in the above two equations is the value of the speed $\omega_{re}$.

Since the voltage to speed ratio is the same, the q-axis voltage $v_{sq}^{r\_25C\_250Vbus}$ has an electrical speed which is 2.5/7 of the speed when the q-axis voltage $v_{sq}^{r\_25C\_700Vbus}$. In other words, if neglecting the voltage drop across the resistance term ($R_s^{25C} i_{sq}^r$), $$v_{sp}^{r\_25C\_700Vbus} = v_{sq}^{r\_25C\_250Vbus} * \frac{\omega_{re}^{700Vbus}}{\omega_{re}^{250Vbus}} = v_{sq}^{r\_25C\_250Vbus} * \frac{700 \text{ Vdc}}{250 \text{ Vdc}}$$

Therefore, when the motor 117 is above the critical speed to convert the q-axis voltage $v_{sq}^{r\_characterization\_25C\_low\_Vdc}$ may be converted to the q-axis voltage $v_{sq}^{r\_characterization\_25C}$ by:

$$v_{sq}^{r\_characterization\_25C} = v_{sq}^{r\_characterization\_25C\_low\_Vdc} * \frac{Vdc_{characterization}}{Vdc_{controller\_low\_voltage}} \quad (9)$$

where $Vdc_{characterization}$ is DC bus voltage level characterization voltage and $Vdc_{controller\_low\_voltage}$ is the fake bus voltage, as described above.

As a result, the motoring lookup table 305 and the braking lookup table 310 store the q-axis voltage for the magnet temperature reference $v_{sq}^{r\_characterization\_25C}$ for each characterization point as $v_q^{25C\_motor}$, $v_q^{25C\_brake}$, respectively. The stored q-axis voltages for the magnet temperature reference $v_{sq}^{r\_characterization\_25C}$ values are common to one characterization DC bus voltage level characterization voltage $Vdc_{characterization}$.

Referring back to FIG. 3, the lookup tables output reference q-axis voltages $v_q^{25C\_motor}$, $v_q^{25C\_brake}$ that correspond to the torque percentage T % and the voltage-speed ratio. If the motor 117 is operating in motoring or braking with a negative speed (the speed opposite than the characterization speed), a module 317 multiplies the selected voltage by a negative 1 to flip the q-axis voltage polarity. A signal DIR represents the speed direction.

The output of the module 317 is the q-axis reference voltage $v_q^{25C\_table}$.

The runtime conversion module 320 modifies the q-axis reference voltage $v_q^{25C\_table}$, if the actual DC bus voltage $Vdc_{runtime}$ is different than a characterization voltage $Vdc_{characterization}$. More specifically, the runtime conversion module 320 generates a final q-axis reference voltage $v_q^{25C}$ as follows:

$$v_{sq}^{r\_25C} = v_{sq}^{r\_25C\_table} * \frac{Vdc_{runtime}}{Vdc_{characterization}} \quad (10)$$

During inverter runtime the rotor magnet temperature estimation module 104 may calculate an instantaneous q-axis voltage $v_{sq}^{r\_runtime}$, or obtain the instantaneous q-axis voltage $v_q$ from the machine terminal voltage estimation module 127, based on the terminal voltage estimation and rotor position using a known algorithm.

To minimize q-axis voltage oscillation, a moving average may be used. A control model has a moving average buffer size parameter which can be used to set the size of the moving average. For example, a buffer size may be set to 255. It should be understood that the buffer size can be set by viewing an estimated q-axis voltage parameter while running different operational points with the dynamometer.

The flux linkage module 325 determines a difference in flux linkage between a runtime flux linkage $\lambda_f^T$ at a temperature T and the flux linkage at the reference temperature $\lambda_f^{25C}$.

By rearranging equation (1), the flux linkage module 325 calculates the runtime flux linkage $\lambda_f^T$ at the magnet temperature T can be calculated (assuming steady state $v_{sq}^r$) as follows:

$$\lambda_f^T = \frac{v_{sq}^{r\_runtime} - R_s^T i_{sq}^r}{\omega_{re}} - L_d i_{sd}^r \quad (11)$$

Moreover, the flux linkage module 325 may determine the flux linkage at the reference temperature $\lambda_f^{25C}$ as follows:

$$\lambda_f^{25C} = \frac{v_{sq}^{r\_25C} - R_s^{25C} i_{sq}^r}{\omega_{re}} - L_d i_{sd}^r \quad (12)$$

During inverter runtime, the flux linkage $\lambda_f^T$ is calculated and subtracted from the flux linkage at the reference temperature $\lambda_f^{25C}$ that corresponds to the same operating point during runtime. As a result, the flux linkage module establishes a change in flux linkage $\Delta\lambda_f$. The change in flux linkage $\Delta\lambda_f$ for the same operational point at magnet temperature T versus a temperature 25° C. can be seen in the equation below.

$$\Delta\lambda_f = \lambda_f^T - \lambda_f^{25C} \quad (13)$$

In an example embodiment, the flux linkages $\lambda_f^T$ and $\lambda_f^{25C}$ are not directly implemented. Instead, the flux linkage module 325 determines the change in flux linkage $\Delta\lambda_f$ using:

$$\Delta\lambda_f = \lambda_f^T - \lambda_f^{25C} = \left[\frac{v_{sq}^{r\_runtime} - R_s^T i_{sq}^r}{\omega_{re}} - L_d i_{sd}^r\right] - \left[\frac{v_{sq}^{r\_25C} - R_s^{25C} i_{sq}^r}{\omega_{re}} - L_d i_{sd}^r\right] \quad (14)$$

Moreover, assuming inductances $L_d$, $L_q$ are only functions of currents $i_d$, $i_q$ and machine parameters which change purely from temperature are the stator winding resistance and flux linkage, inductances $L_d$, $L_q$ and currents $i_d$, $i_q$ at magnet temperature T equal inductances $L_d$, $L_q$ and currents $i_d$, $i_q$ at room temperature (25° C.) for the same operating point. Finally, the stator winding resistance change due to machine temperature may be neglected so that $R_s^T = R_s^{25C}$.

Consequently, the flux linkage module 325 may determine the change in flux linkage $\Delta\lambda_f$ using:

$$\Delta\lambda_f = \lambda_f^T - \lambda_f^{25C} = \left[\frac{v_{sq}^{r\_runtime}}{\omega_{re}}\right] - \left[\frac{v_{sq}^{r\_25C}}{\omega_{re}}\right] = \frac{\Delta v_{sq}^r}{\omega_{re}} \quad (15)$$

where $\Delta v_{sq}^r$ is a difference between $v_{sq}^{r\_runtime}$ and $v_{sq}^{r\_25C}$.

The temperature calculation module 330 then determines an estimated magnet temperature T using the equation below:

$$T = 25 + \frac{\Delta\lambda_f}{\lambda_f^{25C} * \zeta} \quad (16)$$

where $\partial$ is the magnet temperature coefficient.

The magnet temperature coefficient $\zeta$ may be set and determined using a dynamometer. Using the dynamometer, the negative temperature coefficient can be calculated. To calculate the negative temperature coefficient ($\zeta$) a relatively low machine speed (minimize mechanical losses) is selected along with two different machine coolant (oil) temperatures. For example a speed of 100 rpm with coolant temperatures of 25° C. and 90° C. are selected. With the drive disabled the motor 117 is spun via the prime mover to 100 rpm and the line voltage of the motor 117 is recorded under test with the power analyzer.

The coolant temperature is then increased to the second selected temperature (90° C.) and permitted to flow through the machine for one hour ensuring thermal equilibrium. The line voltage is then recorded at 100 and −100 rpm. The per phase flux linkage for each temperature is calculated using equation (6).

A negative magnet temperature coefficient for positive speed can be derived. To calculate a negative temperature coefficient for positive speed $\zeta_{positive\_speed}$, the calculated flux linkages at +100 rpm may be used as follows:

$$\zeta_{positive\_speed} = \frac{(\lambda_f^{90C} - \lambda_f^{25C})}{\lambda_f^{25C} * (90 - 25)} \quad (17)$$

For symmetry, a negative magnet temperature coefficient $\zeta_{negative\_speed}$ is calculated using the recorded flux linkages at negative speed and equation (16). Then to get the final negative magnet temperature coefficient take an average of the positive and negative temperature coefficient as shown below:

$$\zeta = \frac{\zeta_{positive\_speed} + \zeta_{negative\_speed}}{2}$$

In an example embodiment, the magnet temperature coefficient $\zeta$ may be obtained from a lookup table where the lookup table provides magnet temperature coefficients corresponding to machine temperatures.

Referring back to FIG. 3, the estimated temperature T may be filtered by a filter 335 to reduce oscillation. The filter 335 may be a low pass filter or moving average filter. The output of the filter 335 may then be provided to the current adjustment module 107 and also sent to the operator display to alert the operator of present rotor magnet temperature (via CAN or another communication protocol).

Figure 4:
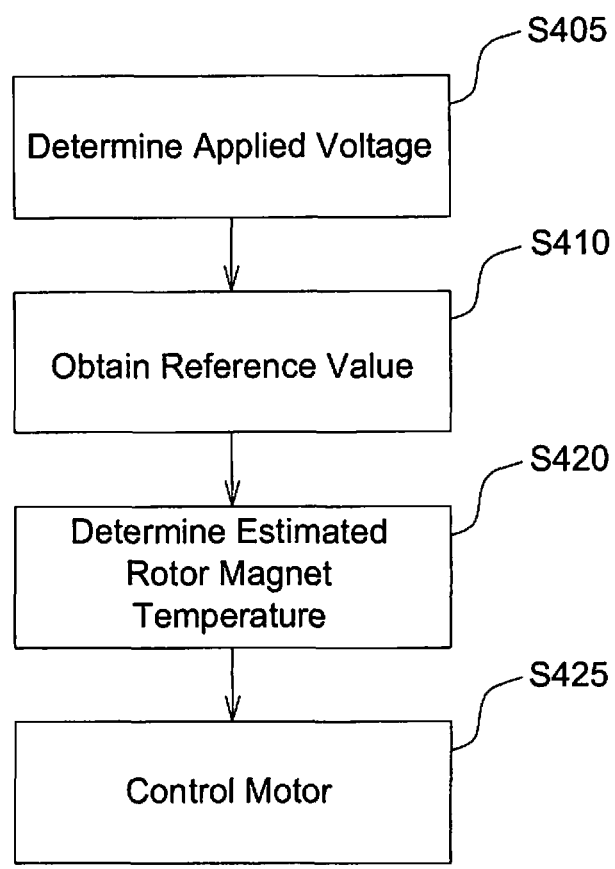

FIG. 4 illustrates a method of estimating a rotor magnet temperature of a motor, according to an example embodiment. The method may be performed by the processing system 120.

At S405, the processing system determines an applied voltage during operation of the motor at an operating point. For example, the processing system determines the instantaneous q-axis voltage $v_{sq}^{r\_runtime}$. At S410, the processing system obtains a reference value, such as $\Delta v_{sq}^r$, that is associated with the operating point and the reference temperature. At S420, the processing system determines an estimated rotor magnet temperature based on the applied voltage and the reference value. At S425, the processing system controls the motor based on the estimated rotor magnet temperature. For example, the processing system uses the estimated rotor magnet temperature to adjust the current.

In an example embodiment, the reference value is a reference quadrature axis voltage.

In an example embodiment, the applied voltage is an instantaneous quadrature axis voltage.

In an example embodiment, the determining the estimated rotor magnet temperature includes determining a difference between the instantaneous quadrature axis voltage and the reference quadrature axis voltage and determining the estimated rotor magnet temperature based on the difference.

In an example embodiment, the determining the estimated rotor magnet temperature based on the difference further includes obtaining a magnet temperature coefficient from a lookup table, the lookup table providing magnet temperature coefficients corresponding to machine temperatures, the estimated rotor magnet temperature being further based on the obtained magnet temperature coefficient.

In an example embodiment, the operating point is a speed and torque of the motor.

In an example embodiment, the method further includes filtering the estimated rotor magnet temperature.

In an example embodiment, the obtaining the reference value includes obtaining a reference voltage from a lookup table, the lookup table being based on the applied voltage and modifying the reference voltage based on a ratio of the applied voltage to a common voltage, the reference value being based on the modified reference voltage.

In an example embodiment, the obtaining the reference value includes obtaining a reference voltage from a lookup table, the lookup table being based on a characterization voltage and modifying the reference voltage based on a ratio of the applied voltage to a characterization voltage, the reference value being based on the modified reference voltage.

Example embodiments being thus described, it will be obvious that the same may be varied in many ways. Such variations are not to be regarded as a departure from the spirit and scope of example embodiments, and all such modifications as would be obvious to one skilled in the art are intended to be included within the scope of the claims.

What is claimed is:

1. A method of estimating a rotor magnet temperature of a motor, the method comprising:
   determining an applied voltage during operation of the motor at an operating point;
   obtaining a reference value associated with the operating point and associated with a reference temperature; and
   determining an estimated rotor magnet temperature based on the applied voltage and the reference value.

2. The method of claim 1, wherein the reference value is a reference quadrature axis voltage.

3. The method of claim 2, wherein the applied voltage is an instantaneous quadrature axis voltage.

4. The method of claim 3, wherein the determining the estimated rotor magnet temperature includes,
   determining a difference between the instantaneous quadrature axis voltage and the reference quadrature axis voltage, and
   determining the estimated rotor magnet temperature based on the difference.

5. The method of claim 4, wherein the determining the estimated rotor magnet temperature based on the difference further includes,
   obtaining a magnet temperature coefficient from a lookup table, the lookup table providing magnet temperature coefficients corresponding to machine temperatures, the estimated rotor magnet temperature being further based on the obtained magnet temperature coefficient.

6. The method of claim 1, wherein the operating point is a speed and torque of the motor.

7. The method of claim 1, further comprising:
   filtering the estimated rotor magnet temperature.

8. The method of claim 1, wherein the obtaining the reference value includes,
   obtaining a reference voltage from a lookup table, the lookup table being based on the applied voltage, and
   modifying the reference voltage based on a ratio of the applied voltage to a common voltage, the reference value being based on the modified reference voltage.

9. The method of claim 1, wherein the obtaining the reference value includes,
   obtaining a reference voltage from a lookup table, the lookup table being based on a characterization voltage, and
   modifying the reference voltage based on a ratio of the applied voltage to a characterization voltage, the reference value being based on the modified reference voltage.

10. A system comprising:
    a processor configured to,
      determine an applied voltage during operation of a motor at an operating point,
      obtain a reference value associated with the operating point and associated with a reference temperature, and
      determine an estimated rotor magnet temperature of the motor based on the applied voltage and the reference value.

11. The system of claim 10, wherein the reference value is a reference quadrature axis voltage.

12. The system of claim 11, wherein the applied voltage is an instantaneous quadrature axis voltage.

13. The system of claim 12, wherein the processor is configured to,
    determine a difference between the instantaneous quadrature axis voltage and the reference quadrature axis voltage, and
    determine the estimated rotor magnet temperature based on the difference.

14. The system of claim 13, wherein the processor is configured to,
    obtain a magnet temperature coefficient from a lookup table, the lookup table providing magnet temperature coefficients corresponding to machine temperatures, the estimated rotor magnet temperature being further based on the obtained magnet temperature coefficient.

15. The system of claim 10, wherein the operating point is a speed and torque of the motor.

16. The system of claim 10, wherein the processor is configured to,
    filter the estimated rotor magnet temperature.

17. The system of claim 10, wherein the processor is configured to,
    obtain a reference voltage from a lookup table, the lookup table being based on the applied voltage, and
    modify the reference voltage based on a ratio of the applied voltage to a common voltage, the reference value being based on the modified reference voltage.

18. The system of claim 10, wherein the processor is configured to,
    obtain a reference voltage from a lookup table, the lookup table being based on a characterization voltage, and
    modify the reference voltage based on a ratio of the applied voltage to a characterization voltage, the reference value being based on the modified reference voltage.

* * * * *